United States Patent [19]

Moslehi

[11] Patent Number: 5,496,750
[45] Date of Patent: Mar. 5, 1996

[54] ELEVATED SOURCE/DRAIN JUNCTION METAL OXIDE SEMICONDUCTOR FIELD-EFFECT TRANSISTOR USING BLANKET SILICON DEPOSITION

[75] Inventor: Mehrdad Moslehi, Los Altos, Calif.

[73] Assignee: Texas Instruments Incorporated, Dallas, Tex.

[21] Appl. No.: 308,771

[22] Filed: Sep. 19, 1994

[51] Int. Cl.[6] .................... H01L 21/265; H01L 21/44; H01L 21/48
[52] U.S. Cl. ................. 437/41; 437/44; 437/192
[58] Field of Search ................... 437/41, 43, 44, 437/92, 200

[56] References Cited

U.S. PATENT DOCUMENTS

| | | | |
|---|---|---|---|
| 4,521,448 | 6/1985 | Sasaki | 437/192 |
| 4,735,916 | 4/1988 | Homma et al. | 437/153 |
| 4,788,160 | 11/1988 | Havemann et al. | 437/192 |
| 4,822,754 | 4/1989 | Lynch et al. | 437/200 |
| 4,824,796 | 4/1989 | Chiu et al. | 437/192 |
| 4,833,099 | 5/1989 | Woo | 437/41 |
| 4,948,745 | 8/1990 | Pfiester et al. | 437/57 |
| 5,156,994 | 10/1992 | Moslehi | 437/200 |
| 5,162,263 | 11/1992 | Kunishima et al. | 437/41 |
| 5,168,072 | 12/1992 | Moslehi | 437/41 |
| 5,198,378 | 3/1993 | Rodder et al. | 437/41 |
| 5,286,667 | 2/1994 | Lin et al. | 437/52 |
| 5,314,832 | 5/1994 | Deleonibus | 437/44 |
| 5,316,977 | 5/1994 | Kunishima et al. | 437/200 |
| 5,322,809 | 6/1994 | Moslehi | 437/41 |
| 5,340,761 | 8/1994 | Loh et al. | 437/192 |
| 5,352,631 | 10/1994 | Sitaram et al. | 437/41 |
| 5,366,928 | 11/1994 | Wolters et al. | 437/280 |

*Primary Examiner*—Olik Chaudhuri
*Assistant Examiner*—Brian K. Dutton

*Attorney, Agent, or Firm*—Carlton H. Hoel; W. James Brady, III; Richard L. Donaldson

[57] ABSTRACT

The described embodiments of the present invention provide a method for fabricating elevated source/drain junction metal oxide semiconductor field-effect transistors. The process does not require the use of selective or epitaxial silicon growth processes. In one embodiment, first a three layer gate stack is formed having a gate dielectric layer (20) beneath a polycrystalline silicon gate layer (22) and a disposable spacer layer (24), such as silicon nitride formed on top of the polycrystalline silicon gate. A conformal dielectric layer is formed overall and anisotropically etched to form sidewall spacers layers (26) on the sides of the gate, and spacer layer stack. The spacer layer (24) is then selectively removed and a layer of amorphous or polycrystalline silicon (30) is deposited overall. A layer of silicon nitride is then deposited on the surface of the polycrystalline silicon layer using chemical-vapor deposition techniques. The silicon nitride layer is etched anisotropically to leave sidewall silicon nitride layers (32) on the portion of the polycrystalline silicon layer over the sidewalls of the gate structure. The exposed layer portion of the polycrystalline silicon layer is then selectively oxidized and a selective silicon nitride etch is then used to remove the sidewall nitride oxidation mask layers, followed by a selective silicon etch to remove the sidewall portion of the polycrystalline silicon layer exposed by the removal of the silicon nitride sidewalls. This leaves elevated source and drain junction regions extending from the sidewalls of the gate on to the field isolation structures surrounding the field-effect transistor area. The silicon layer 40 and 42 extending over the field insulating layer (18) can be patterned and used for local interconnects. The microlithography patterning and silicon dioxide/silicon etch processes for definition of the local interconnect layers can be performed after the selective oxidation process step and prior or after the sidewall nitride and silicon removal.

59 Claims, 2 Drawing Sheets

ELEVATED SOURCE/DRAIN JUNCTION METAL OXIDE SEMICONDUCTOR FIELD-EFFECT TRANSISTOR USING BLANKET SILICON DEPOSITION

FIELD OF THE INVENTION

The present invention relates to the field of microelectronics and integrated circuit technology. More specifically, the present invention relates to the fabrication of insulated-gate field-effect transistor (IGFET) devices with elevated (raised) source/drain junctions.

BACKGROUND OF THE INVENTION

Elevated source/drain junction metal oxide semiconductor field effect transistors (MOSFETs) have been proposed to eliminate the short channel and drain-induced barrier lowering (DIBL) effects of scaled submicron transistors. Fabrication of the elevated source/drain junction structure using conventional prior art methods requires the use of selective epitaxial semiconductor growth or selective silicon growth (SSG). For example, see Rodder, et al., U.S. Pat. No. 5,198,378, issued Mar. 30, 1993 and assigned to the assignee of this application. The elevated source/drain Junction structure allows formation of source/drain junctions with very shallow electrical junction depth from the surface of the MOSFET channel, along with low sheet resistance, self-aligned silicide layers on the surfaces of the elevated source/drain junctions. Device structures with elevated source/drain junctions allow formation of relatively thick, self-aligned silicide layers without the problem of excessive junction leakage.

The elevated source/drain junction structures are expected to be useful for transistors having line width or channel length dimensions (i.e., transistors having a gate length from source to drain) of 0.25μ or less. However, successful implementation of elevated source/drain junction structures requires reliable selective epitaxial silicon growth or selective polycrystalline or amorphous silicon growth processes and related fabrication equipment. However, these processes and related equipment have many problems related to process performance, deposition selectivity controls, facet formation, and process contamination sensitivity problems. Also, most selective silicon growth (SSG) processes are optimally performed at temperatures greater than 700° C., which may cause transistor reliability degradations due to presence of hydrogen in the silicon deposition process medium. Moreover, higher deposition temperatures (T≧850° C.) typically used for the SEG process can result in redistribution of the dopant profiles in the IGFET device structure such as the channel dopant profile and the source/drain lightly doped drain (LDD). These problems indicate that there is a need for a fabrication method for forming elevated source/drain junction structures without the use of selective epitaxial semiconductor growth or selective semiconductor growth processes.

SUMMARY OF THE INVENTION

The described embodiments of the present invention provide a method for fabricating elevated source/drain junction, metal oxide semiconductor field-effect transistors. The process does not require the use of selective semiconductor growth processes. In one embodiment, a MOSFET gate stack is formed having a gate dielectric layer beneath a polycrystalline silicon gate layer and a disposable layer, such as silicon nitride, formed on top of the polycrystalline silicon gate. A conformal layer of, for example, silicon dioxide is formed overall (using a conformal low-pressure chemical vapor deposition or LPCVD process) and anisotropically etched to form sidewall spacers on the sides of the polysilicon gate, and disposable layer stack. The disposable nitride layer is then removed and a layer of polycrystalline silicon or amorphous silicon is deposited overall. The polysilicon deposition process can be performed in a chemical-vapor (CVD) equipment for later deposition of other materials. A layer of silicon nitride is then deposited on the surface of the polycrystalline silicon layer probably using non-conformal (CVD) techniques. The silicon nitride layer is etched anisotropically using a selective plasma etch process to leave sidewall silicon nitride layers on the portion of the polycrystalline or amorphous silicon layer over the sidewalls of the gate structure. The exposed portion of the polycrystalline silicon layer is then thermally oxidized. A selective isotropic silicon nitride etch is then used to remove the sidewall silicon nitride layers, followed by a selective silicon etch to selectively remove the portion of the polycrystalline silicon or amorphous silicon layer exposed by the removal of the silicon nitride sidewalls. This leaves elevated source and drain junctions extending from the sidewalls of the gate on to the isolation structures surrounding the field-effect transistor gate area.

DETAILED DESCRIPTION OF THE DRAWINGS

FIGS. 1 through 8 are side view schematic diagrams showing one embodiment of the present invention. The detailed description presented here is for an n-channel IGFET or NMOS transistor device. However, the method of this invention is also applicable to fabrication of p-channel IGFET or PMOS transistor devices.

Figure 1:
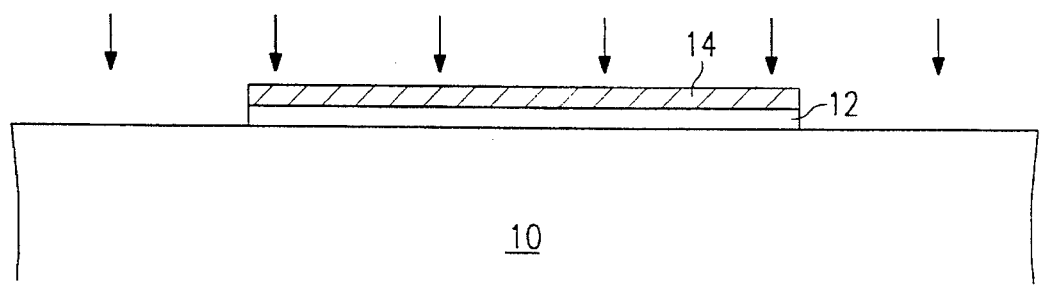
FIGS. 1 through 8 are side view schematic diagrams showing the processes of one embodiment of the present invention.
Figure 2:
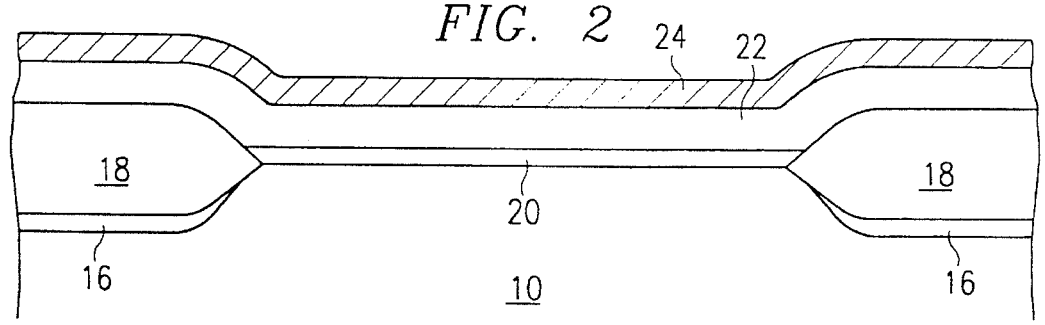

The described embodiment begins with FIG. 1, at this stage the doped wells (e.g. p and n wells) have already been formed, Silicon dioxide layer 12 is formed on the surface of silicon substrate 10 using a thermal oxidation process and silicon nitride layer 14 is formed on the surface of silicon dioxide layer 12 using a chemical-vapor deposition (CVD) technique. Silicon nitride layer 14 and silicon dioxide layer 12 are than patterned using well-known microlithography and plasma etch processes to form the LOCOS mask. An alternative structure may be used which includes a thin polysilicon layer (not shown) between the silicon nitride 14 and silicon dioxide 12 layers. This alternative structure (called poly buffered LOCOS or PBL) is patterned similar to the one shown in FIG. 1. A channel stop implant is then performed as indicated by the arrows in FIG. 1. The structure of FIG. 1 is subjected to thermal oxidation in a steam or oxygen environment to form field oxide regions 18 and channel stop regions 16 as shown in FIG. 2. After the field oxidation process the LOCOS mask layers 12 and 14 are removed. A silicon dioxide gate dielectric layer 20 is then formed using thermal oxidation techniques. The gate dielectric layer 20 may also be formed using nitride-oxide or oxynitirde materials. Polycrystalline silicon layer 22 (or silicon/geranium alloy layer) is then formed on the surface of silicon dioxide layer 20 using a chemical vapor deposition (CVD) process to a thickness of approximately 2,000 Å to 3,000 Å. Silicon nitride layer 24 is then formed on the surface of polycrystalline silicon gate electrode layer 22 using chemical-vapor deposition techniques to a thickness of approximately 1,000 Å to 1,500 Å. The 2-layer structure of polycrystalline silicon gate electrode layer 22 and silicon nitride layer 24 is patterned and etched using well-known microlithography and anisotropic plasma etching methods to form the gate stack shown in FIG. 3.

Figure 3:
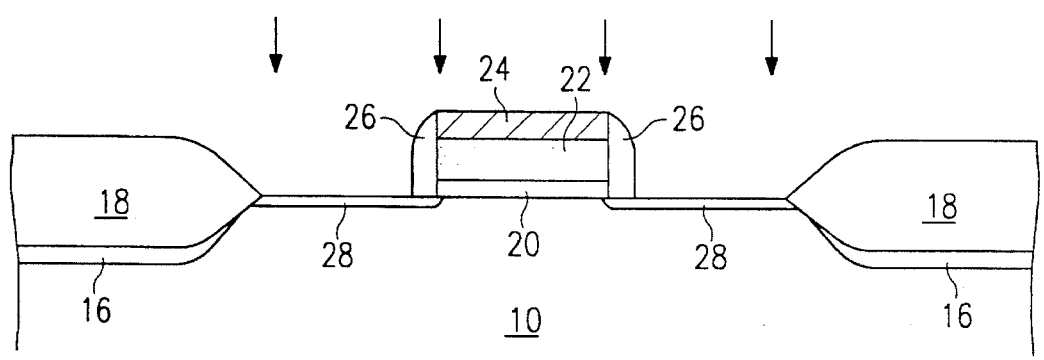
Figure 4:
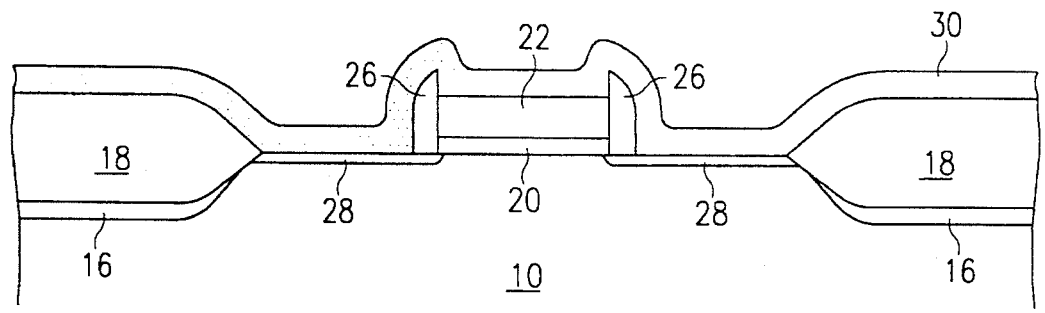
Figure 5:
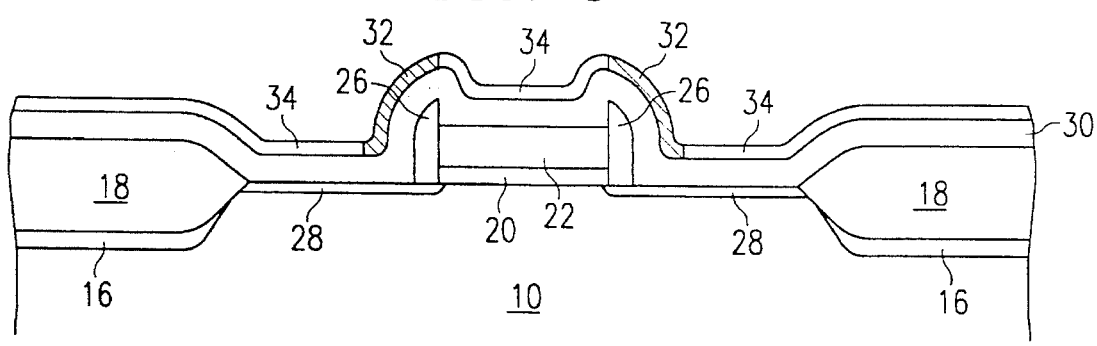

A thin blanket layer of silicon dioxide, or another dielectric material (not shown) is then formed using a conformal chemical-vapor deposition (CVD) process. The structure of FIG. 3 is then subjected to an implantation of phosphorous or arsenic ions having a dose of 2 to $8 \times 10^{13}/cm^2$ at 30 to 50 KeV, to form shallow lightly doped drain or LDD junction regions 28 as shown in FIG. 3. Fabrication of the LDD junction regions is optional for the purpose of this invention. Then, another blanket layer of silicon dioxide or another suitable dielectric material (not shown) is formed using a conformal chemical-vapor deposition (CVD) process. The silicon dioxide layer (not shown) is then subjected to an anisotropic plasma etching process to form the sidewall dielectric spacers 26. Silicon nitride layer 24 is then removed using a selective plasma etch or a hot phosphoric acid ($H_3PO_4$) wet strip and a layer of polycrystalline silicon 30 is deposited using a low-pressure chemical-vapor deposition (LPCVD) process or a physical-vapor deposition (PVD) process such as evaporation or sputtering as shown in FIG. 4. The silicon layer 30 may be deposited either way a conformal or a partially conformal deposition process. The preference is to use a partially conformal PVD or CVD process which deposits a thinner silicon layer on the dielectric spacer 26 then on the flat surfaces (such as on the source/drain junction 28 and field insulating 18 regions). The PVD processes such as evaporation and sputtering usually deposit material layers with partial conformality (typically 20% to 70%). The CVD process parameters may also be adjusted in order to achieve reduced deposition conformalities (e.g. 30% to 85%). A thin (200 to 1000 Å) conformal silicon nitride layer is then formed using low-pressure chemical-vapor deposition or plasma enhanced chemical-vapor deposition (PECVD). This layer is then subjected to anisotropic ion etching in a suitable plasma chemistry such as $CHF_3/CF_4/O_2$/Ar plasma to form sidewall nitride spacers 32 as shown in FIG. 5. The resulting structure is then subjected to thermal oxidation in an oxygen or steam ambient at a temperature of approximately 800° to 1000° C. for approximately 1 to 30 minutes to form silicon dioxide layer 34 having a thickness of approximately 100 to 500 Å on the exposed portions of polycrystalline silicon layer 30. The sidewall silicon nitride spacers 32 serve as an oxidation mask and prevent silicon dioxide growth on the sidewall portion of silicon layer 30.

Figure 6:
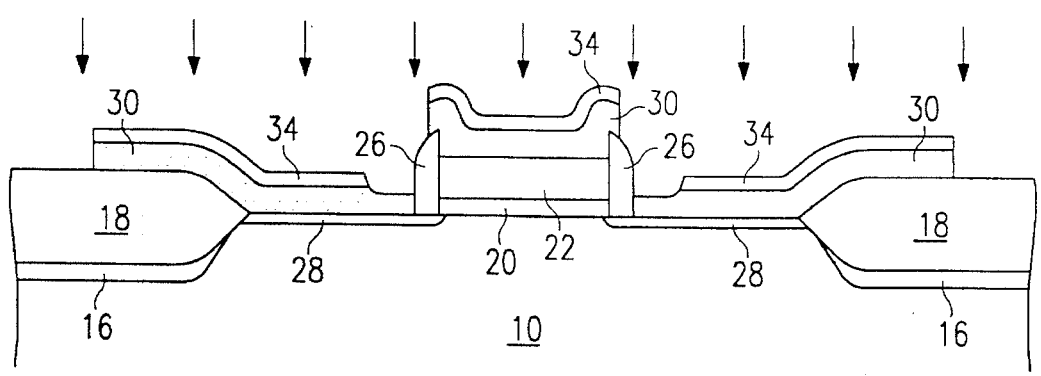
Figure 7:
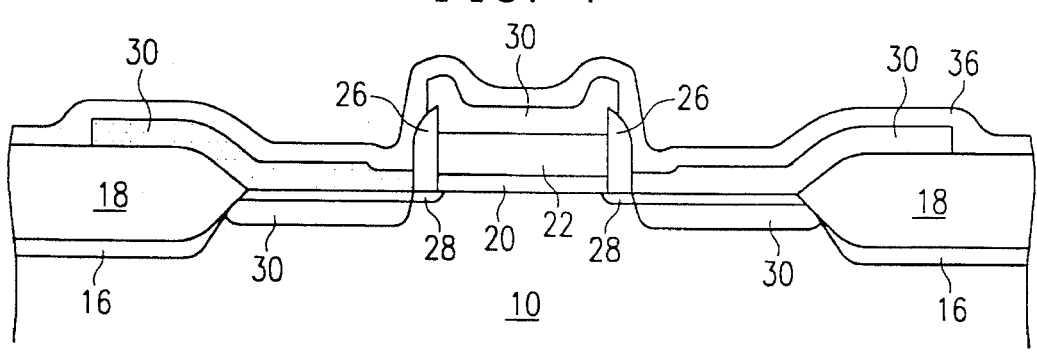

Using well-known photolithographic techniques, the portion of silicon dioxide layers 34 and polycrystalline silicon layer 30 which are not necessary to provide conductors are patterned and subsequently etched on the areas above field oxide regions 18 as shown in FIG. 6. This process step results in formation of the local interconnect region over the field oxide regions which are subsequently covered with a self-aligned silicide layer. Silicon nitride sidewall spacers 32 are then removed using a selective isotropic etch. This etch process can be accomplished using plasma or a wet strip chemistry. The resulting structure is then subjected a selective silicon etch using a plasma etch process (e.g., $CL_2$ plasma). The portions of polycrystalline silicon layer 30 which are exposed by the removal of sidewall spacer nitride layers 32 are then removed down to sidewall oxide spacer layers 26. This clearly defines the portion of polycrystalline silicon layer 30 overlaying the device gate and the portions of polycrystalline silicon layer 30 which overlay the source/drain junction areas and extend on to field oxide regions 18 (the starting silicon for local interconnects). The structure of FIG. 6 is then subjected to an ion implantation of arsenic and/or phosphorus ions having a concentration of 1 to $3 \times 10^{15}/cm^2$ and an implant energy of 30 to 100 KeV. When driven in, using a furnace anneal for rapid thermal anneal step, this forms heavily doped shallow source/drain junctions regions 30 as shown in FIG. 7. After removal of silicon dioxide layer 34, a layer of titanium (or another suitable refractory metal such as cobalt) is then deposited using sputtering to form titanium layer 36 overall. The structure of FIG. 7 is then subjected to annealing at approximately 585° C. for about 25 minutes (or at 850 degrees to 700 degrees for 30–180 sec using rapid thermal processing) in a nitrogen ambient. The unreacted portions of the titanium layer 36 and the portion of titanium layer which has reacted with the nitrogen ambient to form titanium nitride are then etched away using a selective etch process leaving titanium silicide cap 38 and silicide source/drain junction extensions 40 and 42 (including silicide local interconnects) as shown in FIG. 8.

Figure 8:
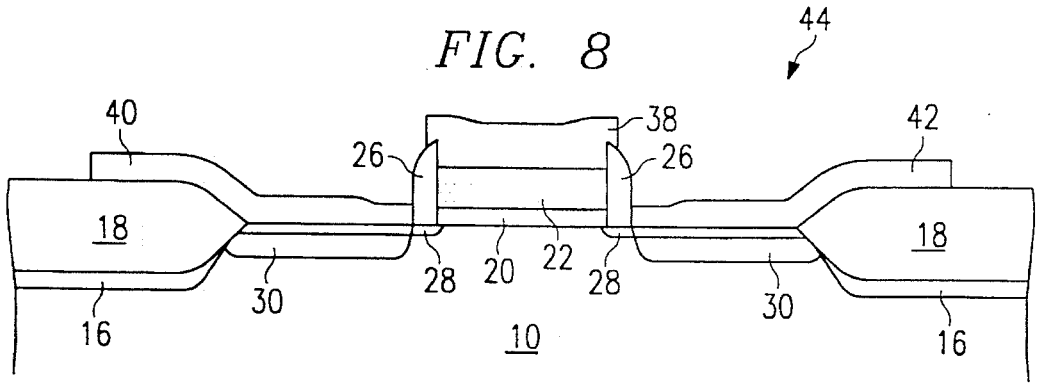

Thus, a MOS field-effect transistor (MOSFET) 44 as shown in FIG. 8 is formed having elevated source/drain junctions, including titanium silicide elevated source 40, titanium silicide elevated drain 42 and gate 22 capped by titanium silicide layer 38. This structure was formed using no selective silicon growth or selective epitaxial growth techniques. Although specific embodiments of the present invention are disclosed herein, this is not to be construed as defining the scope of the invention. The scope of the invention is defined only by the claims appended hereto.

I claim:

1. A method for forming an insulated-gate field-effect transistor comprising the steps of:

forming a field isolation region surrounding active transistor device regions in a semiconductor substrate;

forming a gate dielectric layer on the surface of said transistor device regions;

forming a gate structure on the surface of said gate dielectric layer;

forming sidewall dielectric spacers on the sidewalls of said gate structure;

forming a blanket conductive layer overall;

forming protective sidewall mask spacers on the portions of said conductive layer extending approximately vertically adjacent to said sidewall dielectric spacers;

forming a protective hard mask layer on the portions of said conductive layer not covered by said protective sidewall mask spacers;

selectively removing said protective sidewall mask spacers; and selectively etching through exposed regions of said conductive layer where said protective sidewall mask spacers were removed to expose said portions of said conductive layer extending approximately vertically adjacent to said sidewall dielectric spacers.

2. The method of claim 1 further comprising the step of: microlithography patterning and patterned etching of said conductive layer over said field isolation region to form the device local interconnects.

3. The method of claim 1 further comprising the step of: microlithography patterning and patterned etching of said conductive layer over said field isolation region to form the transistor device connections using electrical contact pads over said field isolation region.

4. A method as in claims 2 or 3 further comprising the steps of:
depositing a refractory metal layer;
forming a refractory metal silicide layer on the transistor device regions with exposed patterned conductive layer or exposed semiconductive surfaces; and
selectively removing the refractory metal nitride and any unreacted refractory metal portions in order to form self-aligned silicide regions.

5. The methods of claims 2 or 3 wherein said microlithography patterning and patterned etching process steps are performed after said selective etching process for removal of portions of said conductive layer extending approximately vertically adjacent to said sidewall dielectric spacers.

6. The methods of claims 2 or 3 wherein said microlithography patterning and patterned etching process steps are performed prior to said selective etching process for removal of portions of said conductive layer extending approximately vertically adjacent to said sidewall dielectric spacers.

7. The method of claim 1 wherein said gate structure consists of a polycrystalline semiconductor material.

8. The method of claim 7, wherein said polycrystalline semiconductor material is silicon.

9. The method of claim 4, wherein said polycrystalline semiconductor material is a silicon-germanium alloy.

10. The method of claim 1 wherein said gate structure consists of a first layer of a polycrystalline semiconductor material and a top second layer of a disposable spacer layer.

11. The method of claim 1 wherein said gate structure consists of a first layer of an amorphous semiconductor material and a top second layer of a disposable spacer layer.

12. The method of claim 1 wherein said conductive layer is deposited using a chemical-vapor deposition process.

13. The method of claim 1 wherein said gate structure consists of an amorphous semiconductor material.

14. The methods of claim 10 or 11 wherein said disposable spacer layer comprises silicon nitride.

15. The method of claim 1 further comprising the step of implanting dopant atoms into said conductive layer and thermally activating and diffusing said dopant atoms into said conductive layer and said substrate to form the transistor source and drain junction regions.

16. A method as in claim 15 wherein said dopant atoms comprise atoms selected from the group consisting of phosphorus, arsenic, and mixtures thereof for n-channel insulated-gate field-effect transistor.

17. A method as in claim 15 wherein said dopant atoms comprise boron for p-channel insulated-gate field-effect transistor.

18. A method as in claim 14 wherein said disposable spacer layer is deposited using a chemical-vapor deposition process.

19. The method of claim 1 wherein said conductive layer is deposited using an evaporation process.

20. The method of claim 1 wherein said conductive layer is deposited using a sputtering process.

21. A method as in claim 1 wherein said field isolation region comprises silicon dioxide.

22. A method as in claim 1 wherein said gate dielectric layer comprises silicon dioxide.

23. A method as in claim 1 wherein said sidewall dielectric spacers comprise silicon dioxide.

24. A method as in claim 1 wherein said protective sidewall mask spacers comprise silicon nitride.

25. A method as in claim 24 wherein said protective sidewall mask spacers comprising silicon nitride are used as oxidation masks protecting sidewall portions of said conductive layer adjacent to said sidewall dielectric spacers against thermal oxidation during a selective thermal oxidation process for formation of said protective hard mask layer.

26. A method as in claim 1 wherein said protective hard mask layer comprises silicon dioxide formed by thermal oxidation.

27. A method as in claim 1 further comprising the step of implanting dopant atoms into said substrate after the formation of said gate structure but before the formation of said conductive layer to form doped junction regions adjacent to said gate structure in said semiconductor substrate.

28. A method as in claim 1 wherein said gate structure is formed by microlithography patterning and anisotropic plasma etching process steps.

29. A method for forming an insulated-gate field-effect transistor comprising the steps of:
forming field isolation regions surrounding active transistor regions in a semiconductor substrate;
forming a gate dielectric layer on the surface of said transistor device regions;
forming a gate structure consisting of a stacked bilayer of a disposable spacer layer on a semiconductor gate electrode on the surface of said gate dielectric layer;
forming sidewall dielectric spacers on the sidewalls of said gate structure;
removing said disposable spacer layer;
forming a blanket conductive layer overall;
forming first protective layers on the portions of said conductive layer extending approximately vertically along the sidewall dielectric spacers;
forming second protective layer on the portions of said conductive layer not covered by said first protective layer;
selectively removing said first protective layers;
etching through said conductive layer where said first protective layers were removed to expose said conductive layer extending approximately vertically along the sidewall dielectric spacers;
implanting dopant atoms in to said conductive layer and diffusing said dopant atoms in to said substrate to form source and drain junction regions;
patterning said conductive layer over said field isolation regions using microlithography and etch process steps to form the transistor electrical contacts;
depositing a second conductive layer which can react with said conductive layer;
heating said second conductive layer to cause said second conductive layer to react with said conductive layer; and
selectively removing the portions of said second conductive which did not react with said conductive layer.

30. A method as in claim 29 wherein said field isolation regions comprise silicon dioxide.

31. A method as in claim 29 wherein said gate dielectric layer comprises silicon dioxide.

32. A method as in claim 29 wherein said disposable spacer layer comprises silicon nitride.

33. A method as in claim 29 wherein said sidewall dielectric spacers comprise silicon dioxide.

34. A method as in claim 29 wherein said first protective layers comprise silicon nitride.

35. A method as in claim 29 wherein said second protective layer comprises silicon dioxide.

36. A method as in claim 29 wherein said dopant atoms comprise atoms selected from the group consisting of phosphorus, arsenic, and mixtures thereof for n-channel and boron for p-channel transistors.

37. A method as in claim 29 further comprising the step of implanting said dopant atoms into said substrate after the formation of said gate structure but before the formation of said conductive layer to form doped junction regions adjacent to said gate structure.

38. A method as in claim 29 wherein said second conductive layer comprises titanium.

39. A method as in claim 29 wherein said second conductive layer comprises cobalt.

40. A method as in claim 29 wherein said blanket conductive layer is deposited using a chemical-vapor deposition or a physical-vapor deposition process.

41. A method for forming a field-effect transistor comprising the steps of:

forming field isolation regions surrounding a transistor region in a semiconductor substrate;

forming a gate insulator layer on the surface of said transistor region;

forming a gate on the surface of said gate insulator layer;

forming a spacer layer on the surface of said gate;

forming from said spacer layer sidewall regions on the sidewalls of said gate;

forming a blanket conductive layer overall;

forming first protective regions on the portions of said conductive layer extending approximately vertical;

forming second protective regions on the portions of said conductive layer not covered by said first protective regions;

selectively removing said first protective regions;

etching through said conductive layer where said first protective regions were removed to expose said sidewall layers; and implanting dopant atoms into said conductive layer and diffusing said dopant atoms into said substrate to form source and drain regions.

42. A method as in claim 41 wherein said field isolation regions comprise silicon dioxide.

43. A method as in claim 41 wherein said gate insulator layer comprises silicon dioxide.

44. A method as in claim 41 wherein said spacer layer comprises silicon nitride.

45. A method as in claim 41 wherein said sidewall regions comprise silicon dioxide.

46. A method as in claim 41 wherein said first protective layers comprise silicon nitride.

47. A method as in claim 41 wherein said second protective layer comprises silicon dioxide.

48. A method as in claim 41 wherein said dopant atoms comprise N type dopant atoms.

49. A method as in claim 41 further comprising the step of implanting second dopant atoms into said substrate after the formation of said sidewall regions but before the formation of said conductive layer to form doped regions beneath said sidewall regions.

50. A method for forming a field-effect transistor comprising the steps of:

forming field isolation regions surrounding a transistor region in a semiconductor substrate;

forming a gate insulator layer on the surface of said transistor region;

forming a gate on the surface of said gate insulator layer;

forming a spacer layer on the surface of said gate;

forming from said spacer layer sidewall regions on the sidewalls of said gate;

forming a blanket conductive layer overall;

forming first protective regions on the portions of said conductive layer extending approximately vertical;

forming second protective regions on the portions of said conductive layer not covered by said first protective regions;

selectively removing said first protective regions;

etching through said conductive layer where said first protective regions were removed to expose said sidewall layers;

implanting dopant atoms into said conductive layer and diffusing said dopant atoms into said substrate to form source and drain regions;

depositing a second conductive layer which reacts with said conductive layer;

heating said second conductive layer to cause said second conductive layer to react with said conductive layer; and removing the portions of said second conductive which did not react with said conductive layer.

51. A method as in claim 50 wherein said field isolation regions comprise silicon dioxide.

52. A method as in claim 50 wherein said gate insulator layer comprises silicon dioxide.

53. A method as in claim 50 wherein said spacer layer comprises silicon nitride.

54. A method as in claim 50 wherein said sidewall regions comprise silicon dioxide.

55. A method as in claim 50 wherein said first protective layers comprise silicon nitride.

56. A method as in claim 50 wherein said second protective layer comprises silicon dioxide.

57. A method as in claim 50 wherein said dopant atoms comprise N type dopant atoms.

58. A method as in claim 50 further comprising the step of implanting second dopant atoms into said substrate after the formation of said sidewall regions but before the formation of said conductive layer to form doped regions beneath said sidewall regions.

59. A method as in claim 50 wherein said second conductive layer comprises titanium.

\* \* \* \* \*